US010096751B2

(12) United States Patent
Ikeda et al.

(10) Patent No.: US 10,096,751 B2
(45) Date of Patent: Oct. 9, 2018

(54) LIGHT EMITTING DEVICE

(71) Applicant: NICHIA CORPORATION, Anan-shi, Tokushima (JP)

(72) Inventors: Tadaaki Ikeda, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/479,854

(22) Filed: Apr. 5, 2017

(65) Prior Publication Data

US 2017/0294561 A1 Oct. 12, 2017

(30) Foreign Application Priority Data

Apr. 6, 2016 (JP) ................... 2016-076811

(51) Int. Cl.
| | |
|---|---|
| *H01L 27/15* | (2006.01) |
| *H01L 33/50* | (2010.01) |
| *H01L 33/56* | (2010.01) |
| *H01L 33/60* | (2010.01) |
| *C09K 11/61* | (2006.01) |

(Continued)

(52) U.S. Cl.
CPC ............ *H01L 33/504* (2013.01); *C08K 3/34* (2013.01); *C09K 11/025* (2013.01); *C09K 11/0883* (2013.01); *C09K 11/617* (2013.01); *C09K 11/7734* (2013.01); *H01L 33/56* (2013.01); *H01L 33/60* (2013.01); *H01L 2933/0091* (2013.01)

(58) Field of Classification Search
CPC ........................ H01H 13/83; H01H 2009/164
See application file for complete search history.

(56) References Cited

U.S. PATENT DOCUMENTS

| | | | |
|---|---|---|---|
| 2011/0121321 A1* | 5/2011 | Kato ................ | C08G 77/04 257/79 |
| 2012/0051075 A1 | 3/2012 | Harada et al. | |

(Continued)

FOREIGN PATENT DOCUMENTS

| | | |
|---|---|---|
| JP | 2010-251621 A | 11/2010 |
| JP | 2011-233552 | 11/2011 |

(Continued)

*Primary Examiner* — Julio J Maldonado
*Assistant Examiner* — Andre' C Stevenson
(74) *Attorney, Agent, or Firm* — Hunton Andrews Kurth LLP

(57) ABSTRACT

A light emitting device is provided. The light emitting device includes a light emitting element, which emits blue light, and a light transmissive member having a first principal face bonded to the light emitting element and a second principal face opposite the first principal face. The light transmissive member has a light transmissive base material and wavelength conversion substances, which are contained in the base material and which absorb the light from the light emitting element and emit light. The wavelength conversion substances are localized in the base material towards the first principal face, and include a first phosphor which emits green to yellow light and a second phosphor which emits red light. The first phosphor is more localized towards the first principal face than the second phosphor. The second phosphor is a manganese-activated fluoride phosphor.

10 Claims, 4 Drawing Sheets

(51) Int. Cl.
      *C09K 11/77*    (2006.01)
      *C09K 11/08*    (2006.01)
      *C09K 11/02*    (2006.01)
      *C08K 3/34*     (2006.01)

(56) References Cited

U.S. PATENT DOCUMENTS

| | | |
|---|---|---|
| 2012/0320607 A1 | 12/2012 | Kinomoto et al. |
| 2013/0207151 A1 | 8/2013 | Eberhardt et al. |
| 2013/0240931 A1 | 9/2013 | Akimoto et al. |
| 2015/0200339 A1 | 7/2015 | Markytan et al. |
| 2015/0207045 A1 | 7/2015 | Wada et al. |
| 2015/0340547 A1 | 11/2015 | Tamaki |
| 2015/0364659 A1 | 12/2015 | Setlur et al. |
| 2016/0081142 A1 | 3/2016 | Abe et al. |
| 2016/0240746 A1* | 8/2016 | Yun ........................ H01L 33/502 |

FOREIGN PATENT DOCUMENTS

| | | |
|---|---|---|
| JP | 2012-049022 A | 3/2012 |
| JP | 2013533363 A | 8/2013 |
| JP | 2013-197309 A | 9/2013 |
| JP | 2015-109483 A | 6/2015 |
| JP | 2015-138838 A | 7/2015 |
| JP | 2015-524620 A | 8/2015 |
| JP | 2015-195294 A | 11/2015 |
| JP | 2015198146 A | 11/2015 |
| JP | 2016-001735 A | 1/2016 |
| WO | 2011/108449 A1 | 9/2011 |
| WO | 2012015581 A1 | 2/2012 |
| WO | 2014122881 A1 | 8/2014 |

\* cited by examiner

LIGHT EMITTING DEVICE

CROSS-REFERENCE TO RELATED APPLICATION

This application claims the benefit of Japanese Patent Application No. 2016-076811, filed on Apr. 6, 2016, the disclosure of which is hereby incorporated by reference in its entirety.

BACKGROUND

The present disclosure relates to a light emitting device.

Japanese Unexamined Patent Application Publication No. 2010-251621, for example, discloses a semiconductor light emitting device comprising a first light emitting composition made by sealing a first phosphor, which is a low refractive index magnesium-activated fluoro complex phosphor, with a first transparent sealing material; a second light emitting composition made by sealing a second phosphor having a higher refractive index than that of the first transparent sealing material with a second transparent sealing material, which has a refractive index higher than that of the first sealing member, but equal to or lower than that of the second phosphor; and a semiconductor light emitting element, which is the light source for exciting the first phosphor and the second phosphor. The patent application publication also discloses that the first light emitting composition and the second light emitting composition are arranged so that the light released from the second phosphor is extracted from the light emitting device via the first light emitting composition.

SUMMARY

However, when the first light emitting composition is provided as the outermost layer as disclosed in the aforementioned patent application publication, the fluoro complex phosphor, which has relatively poor resistance to environmental factors, is likely to easily degrade, thereby reducing the reliability of the light emitting device.

Accordingly, an object of an embodiment of the present disclosure is to provide a highly reliable light emitting device with reduced degradation of a manganese-activated fluoride phosphor.

A light emitting device according to an embodiment of the present disclosure is characterized by comprising a light emitting element, which emits blue light, and a light transmissive member having a first principal face bonded to the light emitting element and a second principal face opposite the first principal face. The light transmissive member has a light transmissive base material and wavelength conversion substances contained in the base material to absorb the light from the light emitting element and emit light. The wavelength conversion substances are localized in the base material towards the first principal face and include a first phosphor, which emits green to yellow light, and a second phosphor, which emits red light. The first phosphor is more localized towards the first principal face than the second phosphor. The second phosphor is a manganese-activated fluoride phosphor.

The light emitting device according to an embodiment of the present disclosure can be a highly reliable light emitting device with reduced degradation of a manganese-activated fluoride phosphor.

DETAILED DESCRIPTION

Figure 1A:
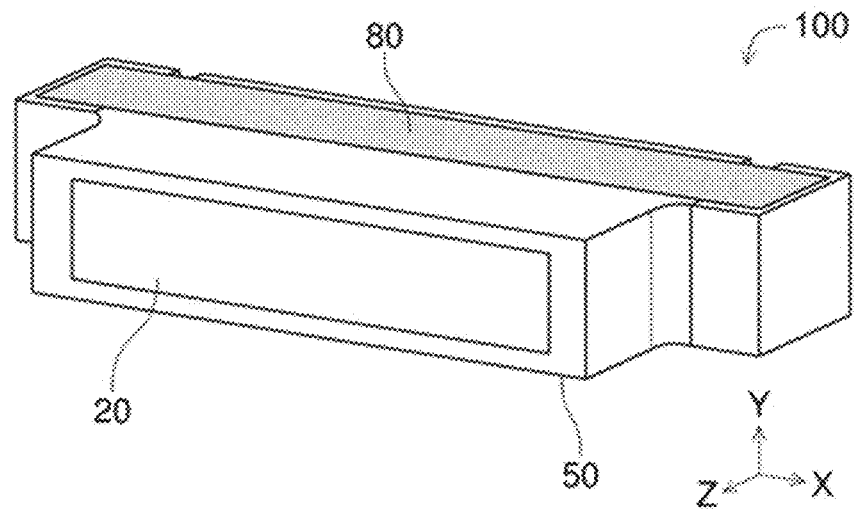
FIG. 1A is a schematic perspective view of a light emitting device according to an embodiment of the present disclosure.

Certain embodiments of the present disclosure will be explained below with reference to the accompanying drawings. The light emitting devices explained below are intended to embody the technical ideas of the present disclosure, and unless otherwise specifically noted, the present disclosure is not limited to those described below. Moreover, the sizes and relative positions of the members shown in the drawings might be exaggerated for clarity of explanation.

It is assumed that the visible spectrum has the wavelengths ranging between 380 nm and 780 nm, the blue region has a wavelength ranging between 420 nm and 480 nm, the green region has a wavelength ranging between 500 nm and 570 nm, the yellow region has a wavelength range that is above 570 nm but 590 nm at most, and the red region has a wavelength ranging between 610 nm and 750 nm.

An Embodiment of Present Disclosure

Figure 1B:
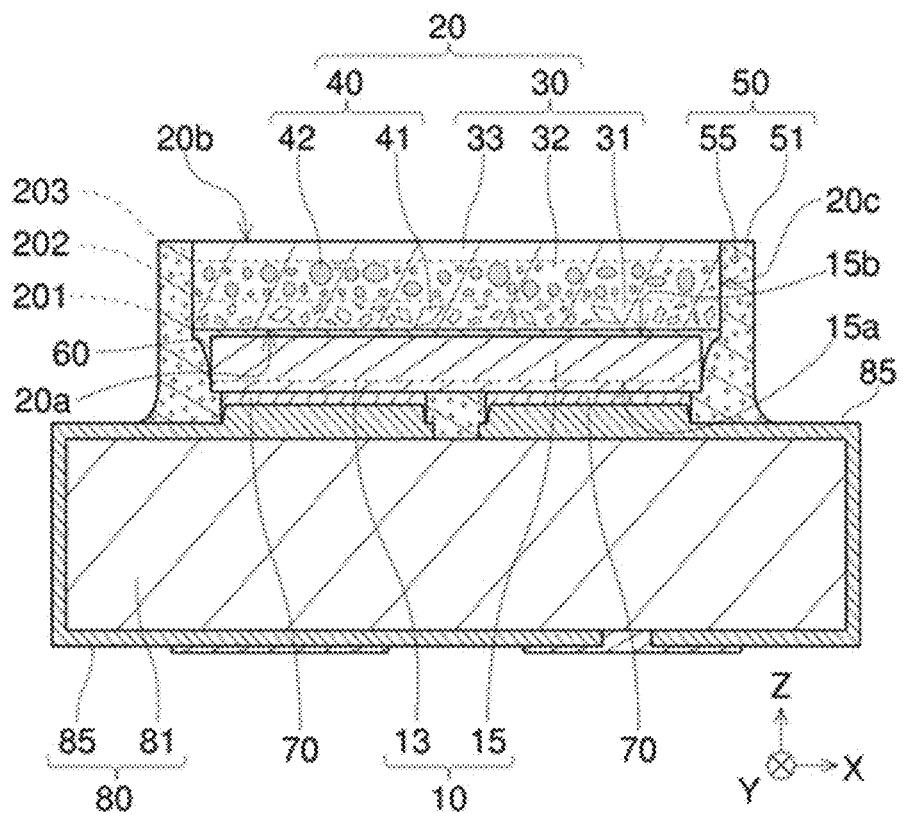
FIG. 1B is a schematic sectional view of the light emitting device in FIG. 1A.

FIG. 1A is a schematic perspective view of a light emitting device 100 according to an embodiment of the present disclosure. FIG. 1B is a schematic sectional view of the light emitting device 100.

In FIGS. 1A and 1B, the horizontal direction, the vertical direction, and the front to back (depth) direction are shown as the X direction, the Y direction, and the Z direction, respectively. Each of the X, Y, and Z directions (axes) is perpendicular to the other two directions (axes). More specifically, the direction to the right is the $X_+$ direction, to the left is the $X_-$ direction, the upward direction is the $Y_+$ direction, the downward direction is the $Y_-$ direction, the direction towards the front is the $Z_+$ direction, and towards the back is the $Z_-$ direction. The $Y_-$ direction is the mounting direction for the light emitting device 100. The $Z_+$ direction is the principal emission direction of the light emitting device 100. The X, Y, and Z directions (axes) in FIGS. 2A and 2B, which are described later, correspond to the X, Y, and Z directions (axes) in FIGS. 1A and 1B. Hereinafter, the face of each constituent element of the light emitting device 100 perpendicular to the $Z_+$ direction is referred to as the "front face," and that is perpendicular to the Z_ direction is referred to as the "rear face."

As shown in FIGS. 1A and 1B, the light emitting device 100 includes a light emitting element 10 and a light transmissive member 20. The light emitting device 100 further includes a light guide member 60, conductive bonding members 70, and a wiring board 80. The light emitting element 10 emits blue light. The light emitting element 10 is bonded to the wiring board 80 via the conductive bonding members 70. The light transmissive member 20 has a first principal face 20*a* bonded to the light emitting element 10 and a second principal face 20*b* opposite the first principal face 20*a*. The bonding between the light emitting element 10 and the light transmissive member 20 is achieved via the light guide member 60. The light transmissive member 20 has a light transmissive base material 30 and wavelength conversion substances 40 contained in the base material 30. The wavelength conversion substances 40 absorb the light from the light emitting element 10 and emit light. The wavelength conversion substances 40 are localized in the base material 30 towards the first principal face 20*a*. The wavelength conversion substances 40 include a first phosphor 41, which emits green to yellow light, and a second phosphor 42, which emits red light. The first phosphor 41 is localized closer to the first principal face 20*a* than the second phosphor 42. The second phosphor 42 is a manganese-activated fluoride phosphor.

In the light emitting device 100 constructed as above, the ratio of the volume occupied by the wavelength conversion substances 40 to the base material 30 of the light transmissive member 20 is higher on the first principal face 20*a* side, which is located on the inner side of the device than on the second principal face 20*b* side, which is closer to the outside. Among the wavelength conversion substances 40, the ratio of the volume occupied by the first phosphor 41 is higher than that of the second phosphor 42 on the first principal face 20*a* side, while the ratio of the volume occupied by the second phosphor 42 is higher than that of the first phosphor 41 on the second principal face 20*b* side. In this manner, the second phosphor 42, which is a manganese-activated fluoride phosphor, is distributed in the middle portion of the light transmissive member 20 in the thickness direction, i.e., in the z direction. Accordingly, the second phosphor 42 can be readily protected against the external environment by the base material 30 located closer to the second principal face 20*b* than the second phosphor 42. Moreover, the first phosphor 41 located closer to the first principal face 20*a* than the second phosphor 42 can moderate the irradiation of the light emitting element 10 against the second phosphor 42, which is a manganese-activated fluoride phosphor that can easily reach saturation in terms of emission efficiency, so as not to be excessive to thereby reduce degradation of the second phosphor 42. In this manner, a highly reliable light emitting device that can reduce degradation of manganese-activated fluoride phosphor can be achieved.

A preferred embodiment of the light emitting device 100 will be explained in detail below.

As shown in FIGS. 1A and 1B, the light emitting device 100 further includes a cover member 50 having optical reflectance. The cover member 50 preferably covers the lateral faces 20*c* located between the first principal face 20*a* and the second principal face 20*b*. This can prevent the light transmissive member 20 from being exposed to the external environment, thereby reducing the degradation particularly of the second phosphor 42. Moreover, since the reduced lateral emission from the light transmissive member 20 promotes the emission and the heat generation of the wavelength conversion substances 40 and can promote the degradation of the wavelength conversion substances 40, particularly the second phosphor 42, the construction of this embodiment is technically highly significant. From the same perspective, the cover member 50 preferably also covers the lateral faces of the light emitting element 10. The cover member 50 is constructed with a base material 51 and a white pigment 55 contained therein.

As shown in FIG. 1B, the light emitting element 10 includes a semiconductor stack 13 and an electrically insulating light transmittive substrate 15. The substrate 15 has a third principal face 15*a* on which the semiconductor stack 13 is disposed and a fourth principal face 15*b* opposite the third principal face 15*a*. In such a case, the first principal face 20*a* of the light transmissive member is preferably bonded to the fourth principal face 15*b* of the substrate. The light emitting element 10 having a substrate 15 can achieve a relatively high production efficiency, as well as easily constructing a flip-chip type emission structure without requiring wire bonding, thereby increasing the optical coupling efficiency into the light transmissive member 20, and light extraction efficiency.

As shown in FIG. 1B, the light transmissive member 20 preferably includes a first layer 201 composed of the base material 30 and the first phosphor 41, a second layer 202 composed of the base material 30 and the second phosphor 42, and a third layer composed of the base material 30 in that order from the first principal face 20*a* to the second principal face 20*b*. This clearly segments the light transmissive member 20 into layers in which the first phosphor 41 and the second phosphor 42 are respectively distributed in the base material 30, which can clearly achieve the functionality and the effect of how the base material 30, the first phosphor 41, and the second phosphor 42 are arranged relative to one another as described above. The first layer 201, the second layer 202, and the third layer 203 are preferably directly in contact with one another, but a base material 30 may be interposed between the layers.

As shown in FIG. 1B, the base material 30 may include a first base material 31, a second base material 32, and a third base material 33, where the first layer 201 is composed of the first base material 31 and the first phosphor 41, the second layer 202 is composed of the second base material 32 and the second phosphor 42, and the third layer 203 is composed of the third base material 33. In such a case, it is preferable to construct the second base material 32 with a material having a refractive index, which is the same as, or a lower than, the refractive index of the first base material 31, while constructing the third base material 33 with a material having a refractive index, which is the same as that of the second base material 32 if it is lower than the first base material 31, or a material having a lower refractive index than that of the second base material 32. This can increase the light extraction efficiency of the light emitting device 100.

From the perspective of affinity between the layers, moreover, it is preferable to construct the entire base material 30 with the same material.

Figure 2A:
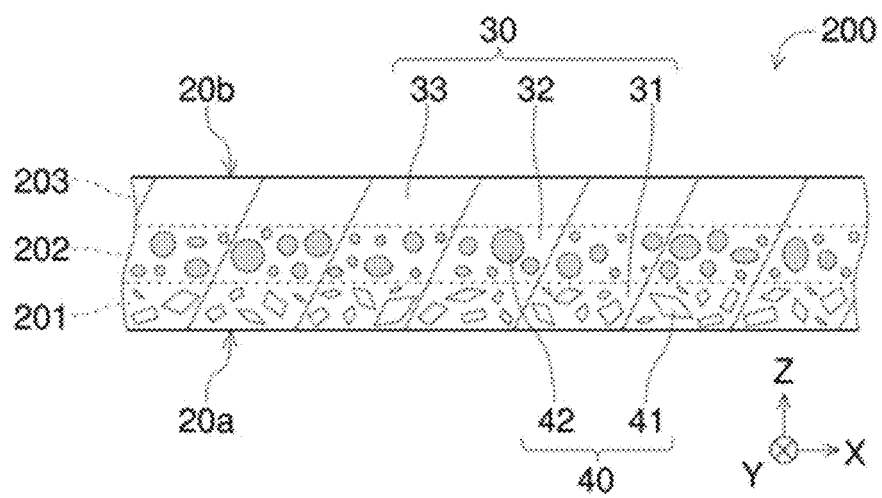
FIG. 2A is a schematic sectional view of a wavelength conversion sheet according to the embodiment in FIGS. 1A and 1B.
Figure 2B:
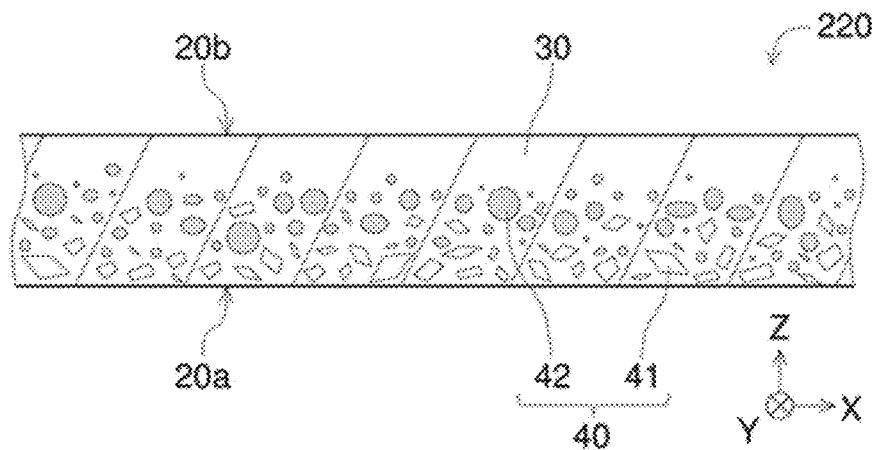
FIG. 2B is a schematic sectional view of another wavelength conversion sheet according to the embodiment in FIGS. 1A and 1B.

FIG. 2A is a schematic sectional view of a wavelength conversion sheet 200 according to the embodiment in FIGS. 1A and 1B. FIG. 2B is a schematic sectional view of another wavelength conversion sheet 220 according to the embodiment in FIGS. 1A and 1B. The light transmissive member 20 used in the light emitting device 100 is obtained, for example, by cutting the wavelength conversion sheet 200 or 220 into small pieces.

As shown in FIGS. 2A and 2B, the wavelength conversion sheet 200 has a first principal face 20*a* and a second principal face 20b opposite the first principal face 20a. The wavelength conversion sheet 200 has a light transmissive base material 30, and wavelength conversion substances 40 contained in the base material 30. The wavelength conversion substances 40 absorb blue light, and emit light. The wavelength conversion substances 40 are localized in the base material 30 toward the first principal face 20a. The wavelength conversion substances 40 include a first phosphor 41 which emits green to yellow light, and a second phosphor 42 which emits red light. The first phosphor 41 is localized closer to the first principal face 20a than the second phosphor 42. The second phosphor 42 is a manganese-activated fluoride phosphor.

The wavelength conversion sheet 200, in particular, can be produced, for example, by pasting together a first sheet 201 composed of the first base material 31 and the first phosphor 41, a second sheet 202 composed of the second base material 32 and the second phosphor 42, and a third sheet 203 composed of the third base material 33 in that order. The light transmissive member 20 prepared by cutting such a wavelength conversion sheet 200 into a small piece is clearly segmented into layers in which the first phosphor 41 and the second phosphor 42 are respectively distributed in the base material 30, clearly achieving the functionality and the effect of how the base material 30, the first phosphor 41, and the second phosphor 42 are arranged relative to one another. For such a wavelength conversion sheet 200, the concentration and the distribution of the wavelength conversion substances 40, and the layer thickness can be easily controlled. Thus, a homogeneous light transmissive member 20 can be easily produced.

The wavelength conversion sheet 220 shown in FIG. 2B can be produced, for example, by allowing the first phosphor 41 to settle first towards the first principal face 20a, followed by allowing the second phosphor 42 to settle above the first phosphor 41 during the steps of mixing the wavelength conversion substances 40 into the base material 30 in a liquid form, and curing the base material 30. At this time, in order to forcibly settle the first phosphor 41 and/or the second phosphor 42, a centrifugation method may be employed. The wavelength conversion sheet 220 and the light transmissive members prepared by cutting the sheet into pieces have the first phosphor 41 and the second phosphor 42 which tend to be localized in the base material 30, while also having a portion where both phosphors are mixed together. This can create a construction that achieves the functionality and the effect of how the base material 30, the first phosphor 41, and the second phosphor 42 are arranged relative to one another described above, while facilitating the mixing of the colors of the light emitted by the first phosphor 41 and the second phosphor 42.

Each constituent element of the light emitting device 100 will be explained below.

Light Emitting Device 100

The light emitting device 100, for example, is a light emitting diode (LED). The light emitting device 100 described above is of a side emission type, also referred to as "side view type," but it can be adapted to be of a top emission type, also referred to as "top view type." In a side emission type light emitting device, the mounting direction is perpendicular to the principal emission direction. In a top emission type light emitting device, the mounting direction is parallel to the principal emission direction. The front view shape, i.e., the shape when viewed from the principal emission direction, of the light emitting device can be suitably selected, but a rectangular shape is preferable in terms of mass production efficiency. The front view shape in the case of a side emission type light emitting device, in particular, is preferably a rectangle having longitudinal and traverse directions. In the case of a top emission type light emitting device, on the other hand, a square shape is preferable. Moreover, it is good for both the light emitting element and the light transmissive member to have a similar front view shape to that of the light emitting device. Alternatively, the light emitting device may be of a chip size package (CSP) type, which does not include a wiring substrate, but instead has positive and negative electrodes for the light emitting element, or projected electrodes joined with the positive and negative electrodes, as the terminals for external connection. Examples of the projected electrodes include bumps and pillars.

Light Emitting Element 10

The light emitting element 10 at least includes a semiconductor stack, which configures a light emitting element structure, and in many cases further includes a substrate. Examples of the light emitting element 10 include an LED chip. The front view shape of the light emitting element 10 is preferably rectangular in shape, particularly a square or a rectangle elongated in one direction (in X direction in FIG. 1A). The lateral faces of the light emitting element 10 or the substrate thereof may be perpendicular to the front face, or be inwardly or outwardly oblique. The light emitting element 10 preferably has positive and negative (p, n) electrodes on the same face. In the case where the light emitting element 10 is of a flip-chip (face down) mounting type, the emission face, i.e., the front face, is one opposite the face on which the electrodes are formed. The light emitting element 10 may include positive and negative electrodes and/or an insulation film. The positive and negative electrodes can be constructed with gold, silver, tin, platinum, rhodium, titanium, aluminum, tungsten, palladium, nickel, or any of their alloys. The insulation film can be constructed with an oxide or a nitride of at least one element selected from the group consisting of silicon, titanium, zirconium, niobium, tantalum, and aluminum. The number of light emitting elements installed in a light emitting device may be one or plural. A plurality of light emitting elements can be connected in series or parallel.

Semiconductor Stack 13

The stack 13 of semiconductor layers at least includes an n-type semiconductor layer and a p-type semiconductor layer, and preferably an active layer interposed therebetween. The peak emission wavelength of the light emitting element 10 can be selected from the ultraviolet region to the infrared region by varying the semiconductor material and/or the mixed crystal ratio. For the semiconductor material, it is preferable to use a nitride semiconductor capable of emitting short wavelength light that can efficiently excite the wavelength conversion substances. A nitride semiconductor is expressed by the general expression, $In_xAl_yGa_{1-x-y}N$ ($0 \leq x$, $x+y \leq 1$). The peak emission wavelength of the light emitting element 10 is preferably in the blue range from the perspective of emission efficiency, excitation of wavelength conversion substances, and color mixing, more preferably in a range between 450 nm and 475 nm. InAlGaAs-based semiconductors, InAlGaP-based semiconductors, zinc sulfide, zinc selenide, silicon carbide or the like can also be used.

Substrate 15

A substrate for crystal growth capable of growing a semiconductor crystal comprising a light emitting element 10 is primarily used for the light emitting element substrate 15, but a substrate for bonding purposes to be bonded to the semiconductor stack 13 separated from a substrate for crystal growth may alternatively be used. A light transmissive substrate easily allows for the employment of flip-chip mounting as well as easily increasing the light extraction efficiency. Examples of the substrate include sapphire, spinel, gallium nitride, aluminum nitride, silicon, silicon carbide, gallium arsenide, indium phosphide, zinc sulfide, zinc oxide, zinc selenide, diamond, and the like. Among all, sapphire is preferable. The thickness of the substrate can be suitably selected, but from the perspective of the strength of the substrate and/or the thickness of the light emitting device 100, the thickness is preferably in a range between 0.02 mm and 1 mm, more preferably in a range between 0.05 mm and 0.3 mm. It is fine to not provide a light emitting element substrate.

Light Transmissive Member 20, Wavelength Conversion Sheet 200, 220

The light transmissive member 20 is a member disposed on the light emitting element 10 to allow the light emitted from the light emitting element 10 to transmit therethrough to the outside of the light emitting device 100. The light transmissive member 20 is constructed at least with a base material 30 and wavelength conversion substances 40 contained in the base material 30, and can function as a wavelength conversion member. For the light transmissive member 20, a sintered body comprising wavelength conversion substances 40 and an inorganic material, for example, alumina, a plate-like crystal of a wavelength conversion substance, or the like can alternatively be used.

Base Material 30 for the Light Transmissive Member 20

The base material 30 for the light transmissive member 20 can be any that is light transmissive for the light emitted by the light emitting element 10. The term "light transmissive" refers to the optical transmittance of the base material being preferably at least 60% at the peak emission wavelengths of the light emitting element 10, more preferably at least 70%, even more preferably at least 80%. The base material 30 can be constructed by using a silicone resin, epoxy resin, phenol resin, polycarbonate resin, acrylic resin, or any of their modified resins. Glass may alternatively be used. Among all, silicone-based resins, i.e., silicone or modified silicone resins, are preferable because they are highly heat and light resistant. Specific examples of silicone resins include dimethyl silicone resin, phenyl-methyl silicone resin, and diphenyl silicone resin. The base material 30 can be constructed with a single layer of one of these materials, or multiple layers of two or more of these materials. The "modified resins" herein include hybrid resins.

The resin or glass used for the base material 30 $f$ described above may contain various fillers. Examples of fillers include silicon oxide, aluminum oxide, zirconium oxide, zinc oxide, and the like. One of these fillers can be used singly, or two or more can be used in combination. Silicon oxide, which has a low thermal expansion coefficient, is particularly preferable. Moreover, the use of nano particles as fillers can increase scattering, including Rayleigh scattering, of the blue light from the light emitting element, thereby reducing the amount of the wavelength conversion substances used. Nano particles are particles having particle sizes in a range between 1 nm and 100 nm. The "particle size" herein is as defined by, for example, the $D_{50}$.

Wavelength Conversion Substance 40

The wavelength conversion substances 40 absorb at least a portion of the primary light emitted from the light emitting element 10, and emit secondary light having a different wavelength from that of the primary light. This can produce a light emitting device 100 emitting white light by mixing colors of the primary and secondary lights, for example. For the wavelength conversion substances 40, one of the specific examples listed below can be used singly, or two or more can be used in combination.

First Phosphor 41

The first phosphor 41 emits green to yellow light. The peak emission wavelength of the first phosphor 41 is preferably in a range between 520 nm and 560 nm from the perspective of emission efficiency and color mixing with the light emitted by another light source. Specific examples of phosphors emitting green light include yttrium aluminum garnet phosphors (e.g., $Y_3(Al, Ga)_5)_{12}$:Ce), lutetium aluminum garnet phosphors (e.g., $Lu_3(Al,Ga)_5)_{12}$:Ce), terbium aluminum garnet phosphors (e.g., $Tb_3(Al,Ga)_5O_{12}$:Ce), silicate phosphors (e.g., $(Ba,Sr)_2SiO_4$:Eu), chlorosiliate phosphors (e.g., $(SiO_4)_4C_{12}$:Eu), β-sialon phosphors (e.g., $Si_{6-z}Al_zO_zN_{8-z}$:Eu (0<z<4.2)), SGS phosphors (e.g., $SrGa_2S_4$:Eu) and the like. Specific examples of phosphors emitting yellow light include α-sialon phosphors (e.g., $M_z(Si,Al)_{12}(O,N)16$ (0<z≤2, M is Li, Mg, Ca, Y, or a lanthanide element other than La and Ce, and the like. Some of the phosphors emitting green light listed above can emit yellow light. For example, the peak emission wavelengths of yttrium aluminum garnet phosphors can be shifted towards longer wavelengths by substituting a portion of Y with Gd, whereby yellow light can be emitted. Moreover, some of these can also emit orange light.

Second Phosphor 42

The second phosphor 42 emits red light. The peak emission wavelength of the second phosphor 42 is preferably in a range between 620 nm and 670 nm from the perspective of emission efficiency and color mixing with the light emitted by another light source. Specific examples of phosphors emitting red light include nitrogen-containing calcium aluminosilicate (CASN or SCASN) phosphors (e.g., (Sr,Ca)$AlSiN_3$:Eu) and the like. Additional examples include manganese-activated fluoride phosphors, expressed by the general expression (I) $A_2[M_{1-a}Mn_aF_6]$, wherein A is at least one selected from the group consisting of K, Li, Na, Rb, Cs, and NH4, M is at least one element selected from the group consisting of the Group 4 elements and the Group 14 elements, and a satisfies 0<a<0. Representative examples of the manganese-activated fluoride phosphors are magnesium-activated potassium fluorosilicate phosphors (e.g., $K_2SiF_6$:Mn).

Cover Member 50

The cover member 50 has optical reflectance. The cover member 50 preferably has optical reflectance of at least 70% at the peak emission wavelength of the light emitting element 10 from the perspective of forward light extraction efficiency, more preferably at least 80%, even more preferably at least 90%. The cover member 50, moreover, is preferably white. Accordingly, the cover member 50 is preferably constructed by containing a white pigment 55 in its base material 51. The cover member, furthermore, can contain similar fillers to those described above for the light transmissive member 20. The cover member 50 is in liquid form before curing. The cover member 50 can be formed by transfer molding, injection molding, compression molding, potting, or the like.

Base Material 51 for the Cover Member 50

A resin can be used for the base material 51 for the cover member 50, and examples include silicone resins, epoxy resins, phenol resins, polycarbonate resins, acrylic resins, or their modified resins. Among all, silicon and modified silicone resins are preferable because they are highly heat and light resistant. Specific examples of silicone resins include dimethyl silicone resin, phenyl-methyl silicone resin, and diphenyl silicone resin. The base material 51 can contain similar fillers to those listed above for the base material 30 for the light transmissive member 20.

White Pigment 55

For the white pigment 55, any one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used singly, or two or more of these can be used in combination. The particle shape of the white pigment 55 can be suitably selected, and can be crushed or irregular shape. From the fluidity perspective, a spherical shape is preferable. The particle size of the white pigment 55 can be, for example, in a range between about 0.1 μm and about 0.5 μm. The content of the white pigment 55 in the cover member 50 can be suitably selected. From the perspective of optical reflectance and viscosity in the fluid state, the content is preferably, for example, in a range between 10 wt % and 70 wt %, more preferably in a range between 30 wt % and 60 wt %. "Wt %" refers to the ratio of the white pigment 55 weight to the total weight of the cover member 50.

Light Guide Member 60

The light guide member 60 bonds the light emitting element 10 and the light transmissive member 20, and guide the light from the light emitting element 10 to the light transmissive member 20. For the base material for the light guide member 60, at least one of silicone resins, epoxy resins, phenol resins, polycarbonate resins, acrylic resins, and their modified resins can be used. Among all silicone or modified silicone resins are preferable because they are highly heat and light resistant. Specific examples of silicone resins include dimethyl silicone resin, phenyl-methyl silicone resin, and diphenyl silicone resin. The base material for the light guide member 60 can contain similar fillers to those listed above for the base material 30 for the light transmissive member 20. The light guide member 60 can be omitted.

Conductive Bonding Members 70

For the conductive bonding members 70, tin-bismuth, tin-copper, tin-silver, or gold-tin solder can be used. The conductive bonding members 70 may alternatively be sintered bodies of silver, gold, copper, platinum, aluminum, or palladium powder bound with a resin binder. These conductive bonding materials are in a paste form before heating, which are melted by heating and subsequently solidified by cooling. Gold, silver, or copper bumps can alternatively be used as the conductive bonding members 70.

Wiring Substrate 80

The wiring substrate 80 includes at least a base 81 and wiring 85 supported by the base 81. The wiring substrate 80 may suitably have an electrically insulating protective film, such as solder resist, coverlay, or the like. For the wiring substrate 80, a rigid substrate is preferable from the perspective of the rigidity of the light emitting device 100, but may alternatively be a flexible substrate.

Base 81

The base 81, in the case of a rigid substrate, can be constructed with a resin, fiber-reinforced resin, ceramic, glass, metal, paper, or the like. Examples of resins or fiber-reinforced resins include epoxy, glass epoxy, bismaleimide triazine (BT), polyimide and the like. Examples of ceramics include aluminum oxide, aluminum nitride, zirconium oxide, zirconium nitride, titanium oxide, titanium nitride, or a mixture of these. Examples of metals include copper, iron, nickel, chromium, aluminum, silver, gold, titanium, or their alloys. The base 81, in the case of a flexible substrate, can be constructed with polyimide, polyethyleneterephtharate, liquid crystal polymer, cycloolefin polymer, or the like.

Wiring 85

The wiring 85 is formed at least on the front face of the body, but can also be formed on the interior and/or the lateral faces and/or the rear face of the base. The wiring 85 preferably includes element connection terminal parts, i.e., lands, where the light emitting element 10 is mounted, external connection terminals to be connected to an external circuit, and lead wiring connecting these terminals. The wiring 85 can be formed with copper, iron, nickel, tungsten, chromium, aluminum, silver gold, titanium, palladium, rhodium, or their alloys. These metals and alloys can be formed as a single layer or multiple layers. Copper or a copper alloy is particularly preferable from the perspective of heat dissipation. The wiring 85 may have an outermost layer made of silver, platinum, aluminum, rhodium, gold or any of their alloys from the perspective of wettability of the conductive bonding members and/or optical reflectance.

EXAMPLE

One example of the present disclosure will be explained in detail below. It goes without saying that the present disclosure is not limited to the example discussed below.

Example 1

The light emitting device according to Example 1 is a side emission type LED, 1.8 mm in length, 0.32 mm in width, and 0.70 mm in depth (thickness) having the construction of the light emitting device 100 shown in FIGS. 1A and 1B.

The wiring substrate 80 is 1.8 mm in length, 0.32 mm in width, and 0.36 in depth (thickness), and has a base 81 and a pair of wiring 85 formed on the base 81 which are arranged in the X direction. The base 81 is a rectangular parallelepiped piece made of BT resin (e.g., HL832NSF type LCA manufactured by Mitsubishi Gas Chemical Company). The pair of wiring 85 is each composed of copper/nickel/gold layers from the base 81 side. The pair of wiring 85 each includes an element connection terminal formed on the front face near the middle in the x direction, and an external connection terminal on the rear face formed from the respective end portion of the front face of the base 81 in the X direction through the lateral face. The element connection terminals each has a projection of the copper layer of 0.04 mm in depth (thickness).

A single light emitting element 10 is flip-chip mounted on the element connection terminals of the pair of wiring 85 via the conductive bonding members 70. The light emitting element 10 is a parallelepiped LED chip, 1.1 mm in length, 0.2 mm in width and 0.12 mm in depth (thickness), and capable of emitting blue light having a peak emission wavelength of 452 nm. The light emitting element 10 is constructed by forming a semiconductor stack 13 stacking an n-type layer, an active layer, and a p-type layer of nitride semiconductor in that order on the rear face of a sapphire substrate 15 (the third principal face 15a). The conductive bonding members 70 are gold-tin solder (Au:Sn=79:21), which are each 0.015 mm in depth (thickness).

On the front face of the light emitting element 10 (the fourth principal face 15b of the substrate), the rear face of the light transmissive member 20 (the first principal face 20a) is bonded via a light guide member 60. The light transmissive member 20 is a parallelepiped piece of 1.21 mm in length, 0.24 mm in width, and 0.16 mm in depth (thickness) made of a base material 30, which contains as wavelength conversion substances an europium-activated β-sialon first phosphor 41 and a manganese-activated potassium fluorosilicate second phosphor 42. More specifically, the light transmissive member 20 is constructed by stacking three layers from the light emitting element 10 side: a layer 201 composed of the base material 31 and the first phosphor 41, a layer 202 composed of the base material 32 and the second phosphor 42, and a layer 203 made of the base material 33. The base material 30, i.e., the base materials 31, 32, and 33 are all phenyl-methyl silicon resin containing nano particles of silicon oxide as a filler. The light guide member 60 is cured dimethyl silicone resin having 0.005 mm in depth (thickness). The light guide member 60 at least partially covers the lateral faces of the light emitting element 10.

On the front face of the substrate 80, the optically reflective cover member 50 is formed so as to surround of the lateral faces of the light emitting element 10 and the light transmissive member 20 along the entire perimeter. The cover member 50, which is 1.35 mm in length and 1.35 mm in width, is composed of a phenyl-methyl silicone resin base material 51 which contains 60 wt % of a white pigment 55 and titanium oxide. The cover member 50 directly covers the lateral faces of the light emitting element 10, the lateral faces 20c of the light transmissive member 20, the lateral faces of the light guide member 60, and the lateral faces of the conductive bonding member 70. The front face of the cover member 50 is substantially coplanar with the front face of the light transmissive member 20. The two lateral faces of the cover member 50 perpendicular to the $Y_+/Y_-$ direction are substantially coplanar with the two faces of the wiring substrate 80 perpendicular to the $Y_+/Y_-$ direction. The lateral faces of the cover member 50 and the wiring substrate 80 perpendicular to the $Y_-$ direction is the mounting face of the light emitting device. Being defined by the cover member 50, the front face of the light transmissive member 20 (the second principal face 20b) substantially forms the emission area of the light emitting device.

Such a light emitting device according to Example 1 was prepared as described below. First, the wavelength conversion sheet 200 was prepared by successively adhering together the first sheet composed of the base material 31 and the first phosphor 41, the second sheet composed of the base material 32 and the second phosphor 42, and the third sheet composed of the base material 33 in this order. Then, the wavelength conversion sheet 200 was cut into small pieces each having the size described above using an ultrasonic cutter. Then, plural light emitting elements 10 arranged in the Y direction were flip-chip mounted on an aggregate substrate. Here, the aggregate substrate has a row of wiring substrates 80 arranged in the Y direction, and plural substrate areas in the X direction partitioned by slits. The mounting of the light emitting elements 10 were performed by applying a paste form gold-tin solder serving as the conductive bonding members 70 to the element connection terminals, mounting the light emitting elements 10 thereon, melting the gold-tin solder in a reflow furnace, and solidifying the solder. Next, the light guide member 60 in a liquid state was applied to the front face of each light emitting element 10, the light transmissive member 20 was placed thereon, and the light guide member 60 was cured by heating in an oven. The processes described above formed plural light emitting structures, each including a light emitting element 10, a light guide member 60, and a light transmissive member 20 in this order, arranged in the Y direction on the aggregate substrate. Next, by using a transfer molding die, a cover member 50 was formed on the aggregate substrate, embedding each of the light emitting structures with a parallelepiped cover member 50. Subsequently, the upper faces of the light transmissive members 20 were exposed by grinding the cover member 50 from the top using a grinder. Lastly, by cutting the cover member 50 and the aggregate substrate between the light emitting structures along the X direction using a dicing machine, the light emitting devices 100 were separated into individual pieces.

Comparative Example 1

The light emitting device used as Comparative Example 1 was prepared in a similar manner to that for the light emitting device of Example 1 except for using a light transmissive member, in which an europium-activated β-sialon phosphor and a manganese-activated potassium fluorosilicate phosphor were uniformly dispersed in the entire base material, instead of the light transmissive member 20 used in Example 1.

Evaluation

Figure 4A:
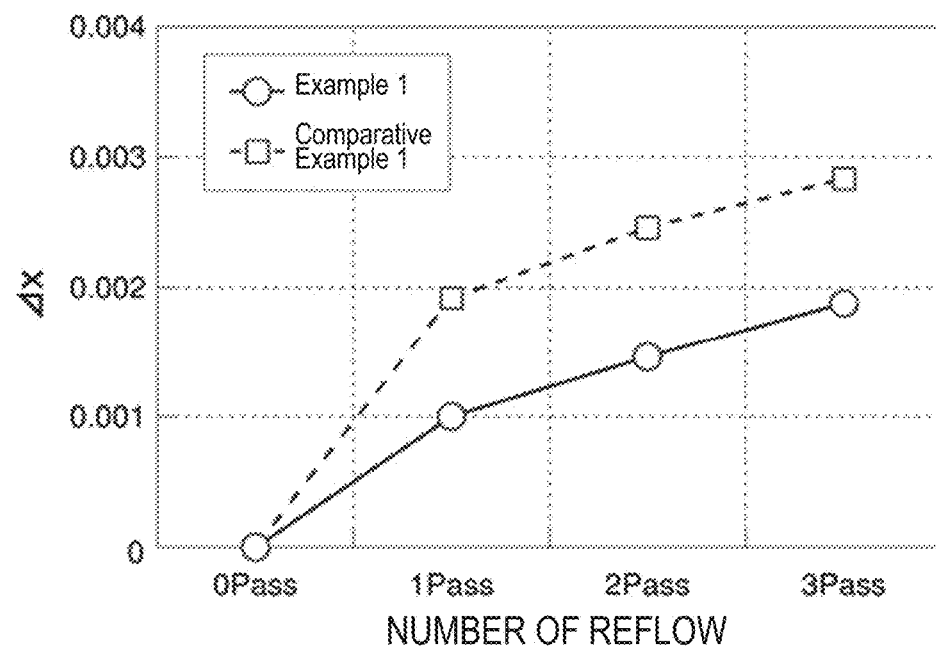
FIG. 4A is a graph showing changes in the chromaticity value x in reflow tests conducted on light emitting devices according to an example of the present disclosure and a comparative example.
Figure 4B:
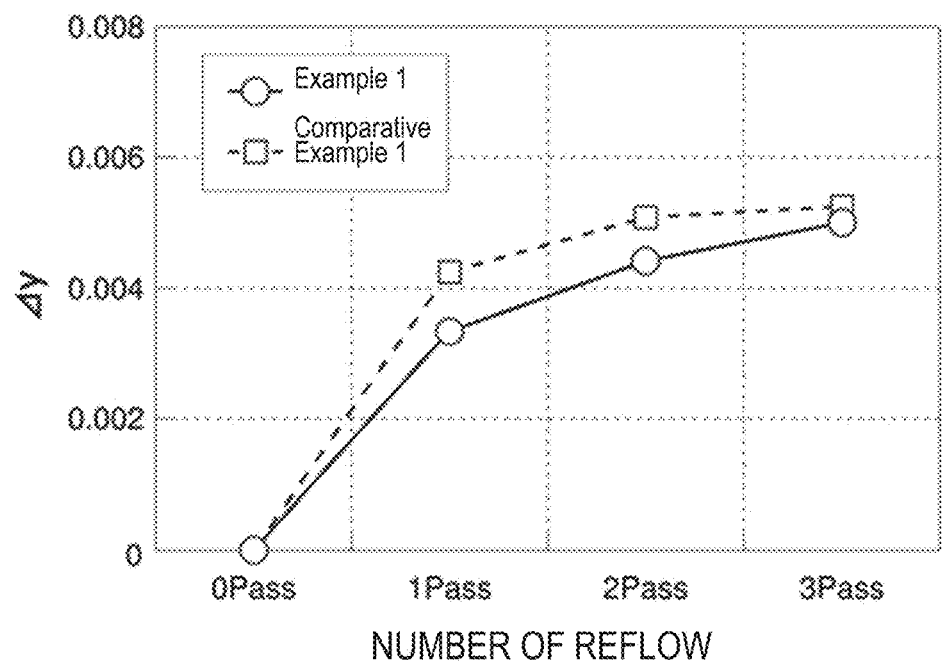
FIG. 4B is a graph showing changes in the chromaticity value y in reflow tests conducted on light emitting devices according to an example of the present disclosure and a comparative example.

By conducting aging tests on the light emitting devices of Example 1 and Comparative Example 1 described above, and measuring the emission chromaticity changes during reflow tests, where the devices were passed through a reflow oven, the reliability of each light emitting device was evaluated. For the ageing tests the samples were aged for 500 hours under the conditions: forward current 20 mA, temperature 60° C., room temperature, and an ambient atmosphere. For the reflow tests, the samples were passed through a reflow oven three times under the conditions: maximum temperature reached 260° C., retention time 10 seconds, and an ambient atmosphere. FIGS. 4A and 4B show the results of these tests.

Figure 3:
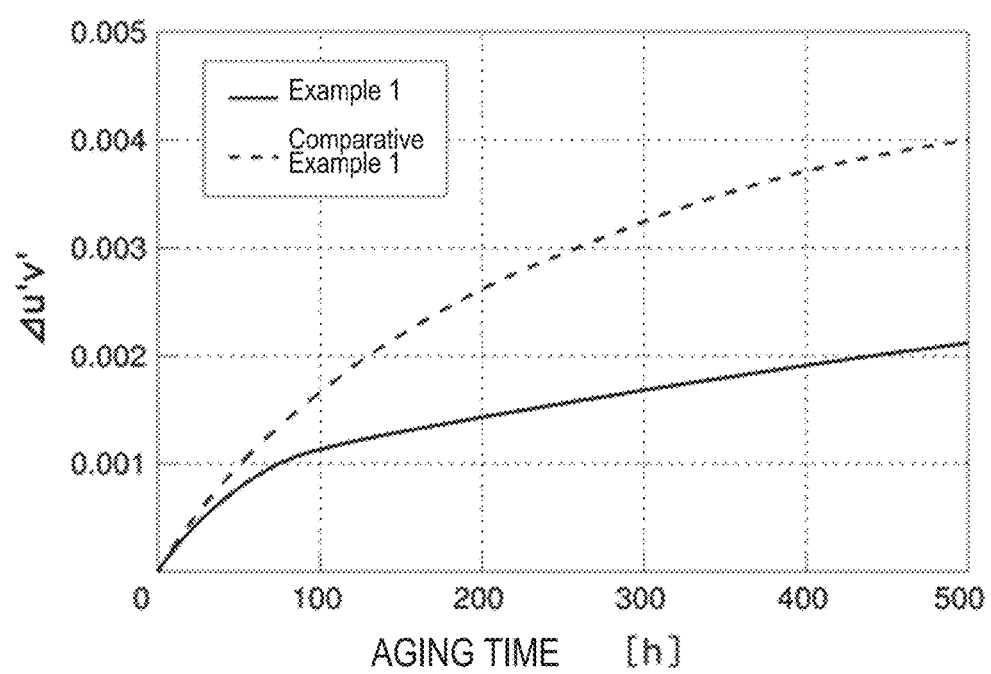
FIG. 3 is a graph showing the changes in emission chromaticity in aging tests conducted on light emitting devices according to an example of the present disclosure and a comparative example.

FIG. 3 is a graph showing the changes of the emission chromaticity of the light emitting devices of Example 1 and Comparative Example 1 measured during the aging tests. FIGS. 4A and 4B are graphs showing the changes of emission chromaticity x values and y values, respectively, measured during the reflow tests conducted on the light emitting devices of Example 1 and Comparative Example 1. The chromaticity (value x and value y) and the chromaticity (value u' and value v') herein conform to the (x, y) chromaticity diagram and the (u', v') chromaticity diagram, respectively, of the International Commission on Illumination (CIE). It is understood from FIGS. 3, 4A, and 4B that the light emitting device of Example 1 is highly reliable as shown by the small emission chromaticity changes resulted as the tests progressed as compared to the light emitting device of Comparative Example 1. It is inferred from this that the positioning of the wavelength conversion substances 40, particularly the manganese-activated potassium fluorosilicate second phosphor 42, in the light transmissive member 20 of Example 1 can moderate the degradation thereof.

The light emitting devices according to certain embodiments of the present disclosure can be utilized in backlights for liquid crystal displays, various types of lighting equipment, large displays, various types of display devices for advertisements and destination signage, projectors, as well as image reading devices for digital video cameras, facsimiles, copiers, and scanners.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising: a light emitting element, which emits blue light; and a light transmissive member having a first principal face bonded to the light emitting element and a second principal face opposite the first principal face, wherein the light transmissive member has a light transmissive base material and wavelength conversion substances, which are contained in the base material and which absorb the light from the light emitting element and emitting light, the wavelength conversion substances are localized in the base material towards the first principal face, and include a first phosphor which emits green to yellow light and a second phosphor which emits red light, the first phosphor is more localized towards the first principal face than the second phosphor, and the second phosphor is a manganese-activated fluoride phosphor wherein the first phosphor and the second phosphor are distinctly different substances contained in the same base material.

2. The light emitting device according to claim 1 further comprising a cover member having an optical reflectance and covering the lateral faces of the light transmissive member between the first principal face and the second principal face.

3. The light emitting device according to claim 1, wherein the second phosphor is manganese-activated potassium fluorosilicate.

4. The light emitting device according to claim 1, wherein the first phosphor is europium-activated β-sialon.

5. The light emitting device according to claim 1, wherein the light transmissive member includes a first layer composed of the base material and the first phosphor, a second layer composed of the base material and the second phosphor, and a third layer composed of the base material in this order from the first principal face to the second principal face.

6. The light emitting device according to any of claim 1, wherein the base material is made of the same material in its entirety.

7. The light emitting device according to claim 1, wherein
the base material includes a first base material, a second base material, and a third base material,
the light transmissive member includes a first layer, a second layer, and a third layer,
the first layer is composed of the first base material and the first phosphor,
the second layer is composed of the second base material and the second phosphor, and
the third layer is composed of the third base material.

8. The light emitting device according to claim 7, wherein
a refractive index of the second base material is either the same as or lower than a refractive index of the first base material, and
a refractive index the third base material is either the same as the refractive index of the second base material if the refractive index of the second base material is lower than the refractive index of the first base material, or lower than the refractive index of the second base material if the refractive index of the second base material is not lower than the refractive index of the first base material.

9. The light emitting device according to claim 1, wherein the base material is a silicone resin or a silicone resin containing a filler.

10. The light emitting device according to claim 1, wherein
the light emitting element includes a semiconductor stack and an electrically insulating light transmittive substrate having a third principal face on which the semiconductor stack is disposed and a fourth principal face opposite the third principal face, and
the first principal face of the light transmissive member is bonded to the fourth principal face of the substrate.

* * * * *